United States Patent [19]

Foley

[11] 4,153,082
[45] May 8, 1979

[54] CUT-CLINCH MECHANISM FOR VARIABLY SPACED LEADS

[75] Inventor: Michael S. Foley, Beverly, Mass.

[73] Assignee: USM Corporation, Farmington, Conn.

[21] Appl. No.: 897,781

[22] Filed: Apr. 19, 1978

[51] Int. Cl.² .............................................. B21F 11/00
[52] U.S. Cl. ................................. 140/105; 140/93 D; 83/200; 29/741
[58] Field of Search .......................... 140/1, 93 D, 105; 227/77, 79; 29/741, 761; 83/199, 200, 580; 72/DIG. 10

[56] References Cited

U.S. PATENT DOCUMENTS 2,893,010   7/1959   Stuhre ..................................... 140/1
3,414,024  12/1968   Anderson et al. ....................... 140/1

*Primary Examiner*—Lowell A. Larson
*Attorney, Agent, or Firm*—Carl E. Johnson; Richard B. Megley; Vincent A. White

[57] ABSTRACT

The mechanism cuts component lead portions projecting from a support such as a circuit board though the leads may be spaced apart at different distances, and then clinches them against the board. Additionally, the mechanism is movable heightwise relative to the support for clearance purposes and adapted to be shifted both in X-Y directions and with selected radial orientation between preset angles. The clinching is done in opposite directions and normal to a line interconnecting the points from which the leads protrude thereby stabilizing the position of a component body.

11 Claims, 7 Drawing Figures

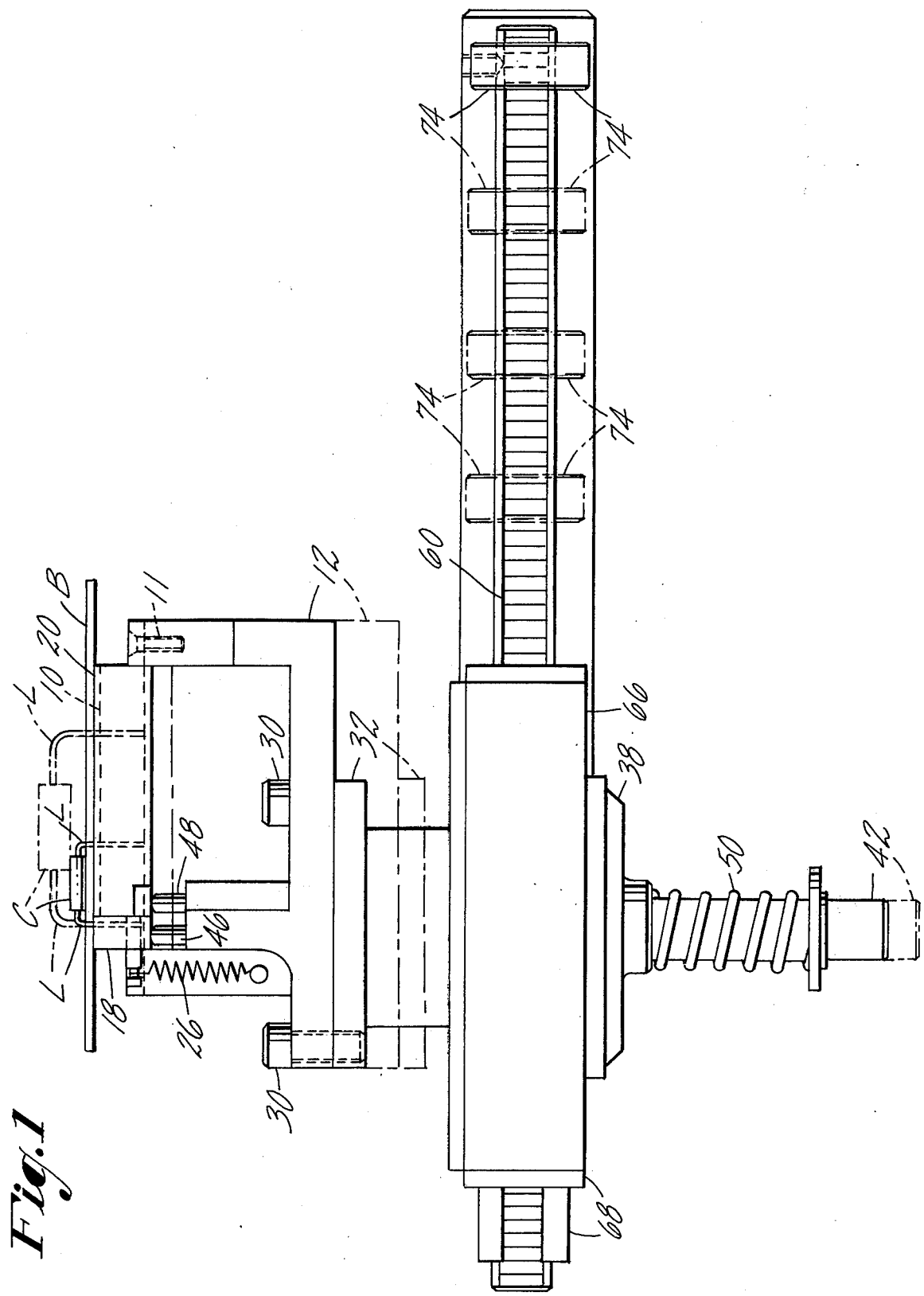

CUT-CLINCH MECHANISM FOR VARIABLY SPACED LEADS

BACKGROUND OF THE INVENTION

This invention relates to mechanism for first simultaneously cutting those lead ends of electrical components which have been thrust through a circuit board or the like, even though for different components lead spacings may vary, and then clinching the cut leads to secure them and effect their connection with circuitry.

In the prior art a number of cut-clinch mechanisms have been provided, some to accommodate manual component mounting and other intended for automatic component inserting apparatus. If the circuit board holding means is shiftable, one known semi-automatic arrangement includes a stationary cut-clinch device which may then incur both safety problems and operator fatigue by reason of the need for continually coping with moving elements. While prior clinching mechanisms have necessarily been shiftable toward and from their operating positions adjacent to the inserted leads to be cut-clinched in order to avoid interferring with previously mounted electrical components, the mechanisms have often been faulty in not assuring adequate component retention and also in endangering, or damaging, or interferring with previously clinched leads.

By way of reference, the following are a few of the lead cut-clinch arrangements disclosed in U.S. Pat. Nos. which may be of interest: 3,986,533 to Woodman, Jr.; 3,429,170 to Romeo; 3,852,865 to Ragard; 2,893,010 to Stuhre; and 3,414,024 to Anderson et al. The last-identified disclosure is notable in that it provides for simultaneously cutting variably spaced leads and then bending them in opposite directions by means of a sleeve and a rod both of which rotate about an axis. The Anderson et al arrangement will, accordingly, in such terms, superficially appear to have resemblance to the subject invention, but one major distinction amongst important others later mentioned is observed in that the patented arrangement is relatively unwieldy and functions to clinch leads only in the direction of a line interconnecting their lead-receiving holes. The latter mode of clinching is commonly found not to assure a sufficient stability for the body of the component on the opposite side of a circuit board from the clinching, any wobbling of the body tending to render the lead electrical connection unsatisfactory.

SUMMARY OF THE INVENTION

In view of the foregoing it is a primary object of this invention to provide an improved, versatile cut-clinch mechanism for operating on the inserted leads of electrical components, the mechanism to be conveniently capable of dealing with such leads when their spacing may vary.

Another object of the invention is to provide a novel cut-clinch device useful on inserted lead portions respectively protruding from holes in a circuit board when such holes are disposed variably apart and with different angular orientation.

A further object of the invention is to provide cut-clinch mechanism whereby, when a component body is mounted on one side of a support and variably spaced leads of the component project from the opposite side of the support, the clinching will cause the projecting end portions of the leads to extend in opposite directions transversely away from the body better to stabilize it on the support.

To these ends the invention comprises a stationary support for a pair of cutting-bending levers of different length rotatable thereon as later described. Vertical through-holes and slots in the levers are initially in alignment with a corresponding hole and slot in the support so that when upper surfaces of the levers contact a circuit board, for instance, the alignment enables reception of the leads of a component to be cut and clinched upon subsequent relative counter rotation of the levers. The lead wires are accordingly, predeterminedly shorn and then, if they extend from opposite ends of the so-called coaxial type component body, for instance, bent generally perpendicular to the body axis (or a line interconnecting the lead-receiving holes of the circuit board) to extend in opposite directions. Preferably, and as herein shown, the elements are pneumatically actuated, and power means is further provided to angularly orient the cut-clinch mechanism as a unit in order to accommodate different orientations of the components being processed.

The compact arrangement of parts lends itself to repositioning cyclically and hence for incorporation in component inserting apparatus which is automatic, semi-automatic, or to simply securing components which have been manually mounted.

BRIEF DESCRIPTION OF THE DRAWINGS

The foregoing and other features of the invention will now be more particularly described in connection with an illustrative embodiment and with reference to the accompanying drawings thereof, in which:

FIG. 1 is a view in side elevation of a mechanism in raised position for cutting and clinching end portions of inserted leads, of variable spacing as indicated by solid and dot-dash lines, of an electrical component;

DESCRIPTION OF PREFERRED EMBODIMENT

Figure 2:
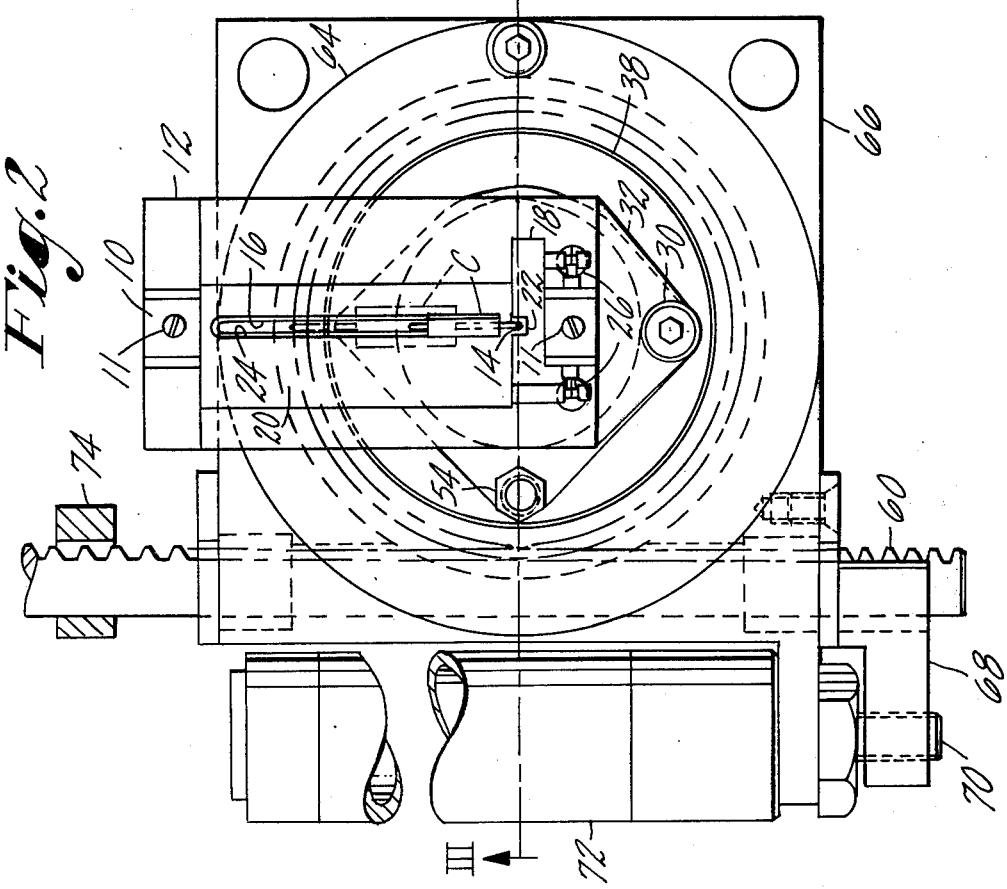
FIG. 2 is a plan view of the mechanism shown in FIG. 1.

A non-rotatable shear bar or shaft 10 is horizontally secured as by bolts or screws 11 (FIGS. 1 and 2) to a support 12 which is movable heightwise toward and from a circuit board B (FIGS. 1, 3 and 4) to the underside of which the variably spaced, inserted leads L,L of different illustative components C are to be clinched after being shorn as will be described later. It will be understood that usage of the invention is not limited to any particular type of shape of component body. Also, though not thus shown, the leads may be pre-crimped above the board B to provide stand-off mounting of the component bodies when so desired. The shaft 10 is formed with a vertical radial through-hole 14 for receiving an inserted lead L (the left-hand one in FIG. 1) endwise, and is provided with an elongated axially aligned through-slot 16 (FIG. 2) for receiving the end of the other lead of a component C. Usually, though not necessarily, bodies of the components are midway between the U-formed leg portions of the leads.

Figure 3:
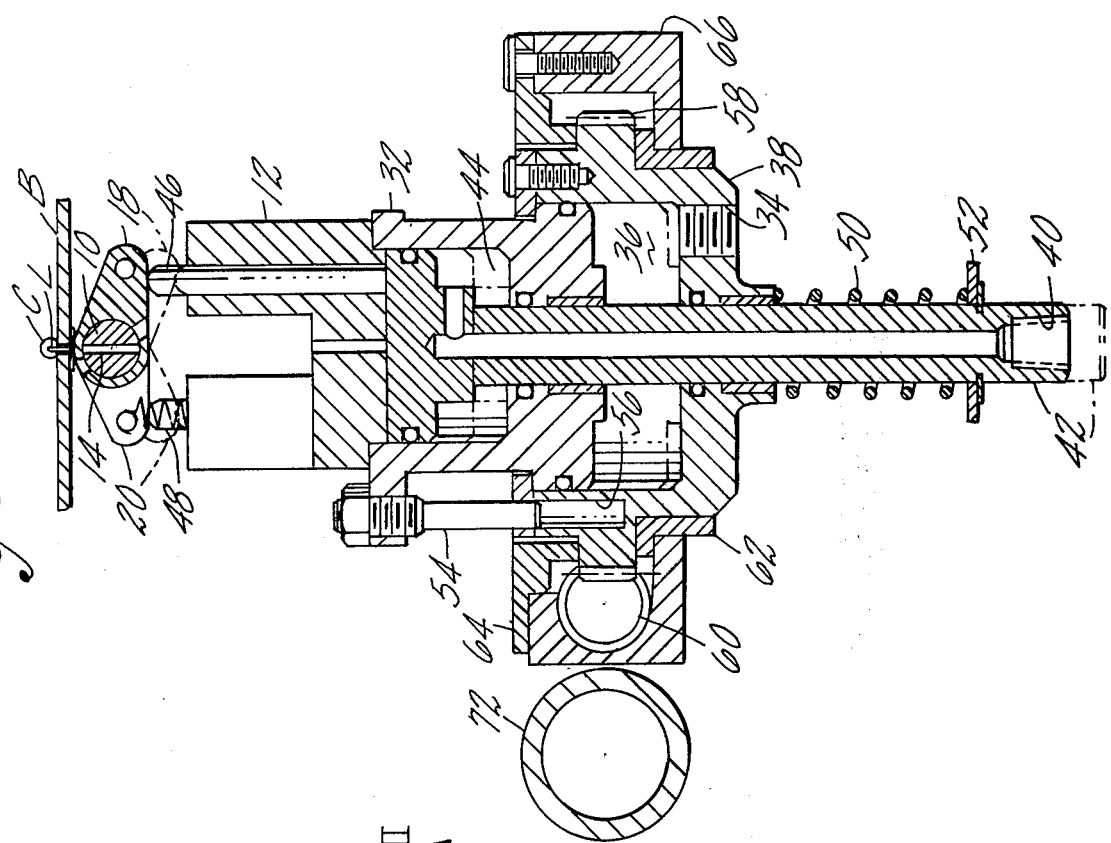
FIG. 3 is a section taken on the line III—III in FIG. 2 and showing details of actuating mechanism when in raised operating position.
Figure 4:
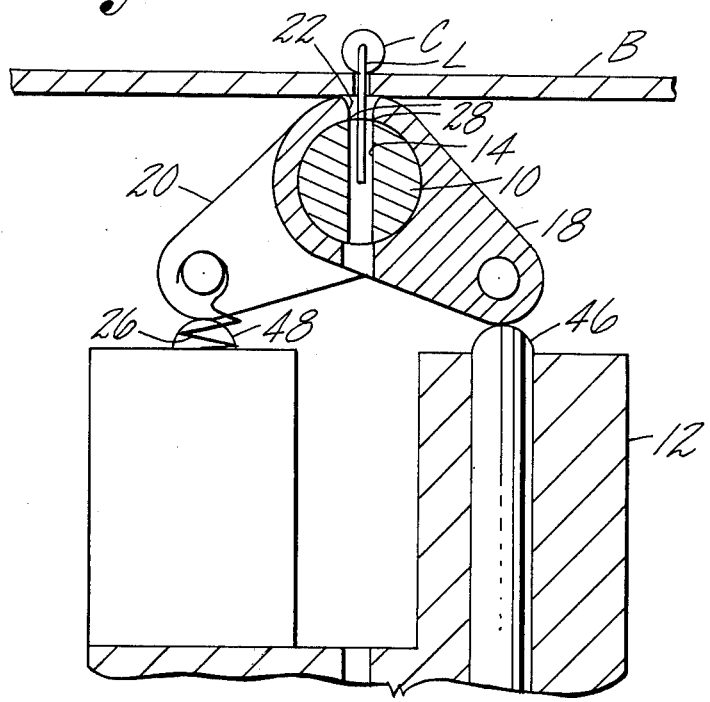
FIG. 4 is an enlarged detail view partly in section, of a portion of FIG. 3 showing an inserted lead (left one in FIG. 1) ready to be cut-clinched.
Figure 5:
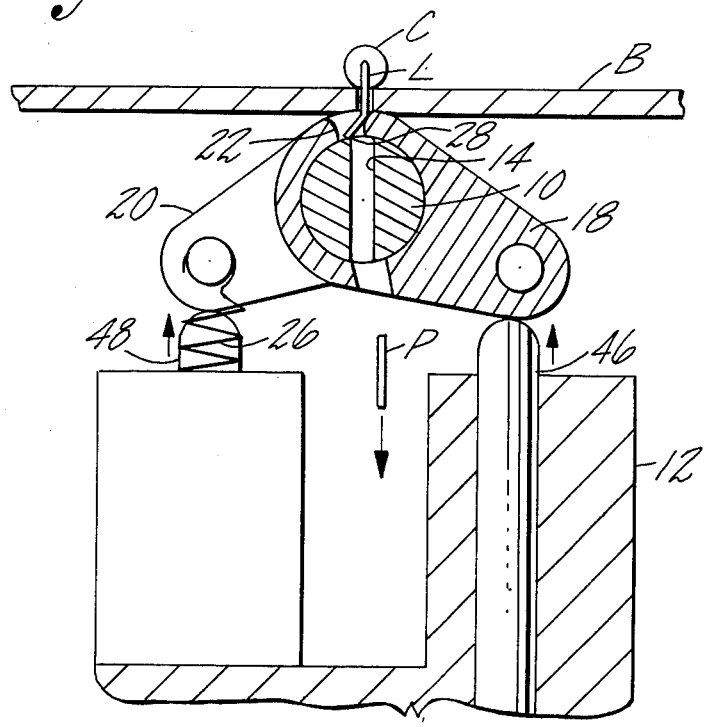
FIGS. 5 and 6 are views similar to FIG. 4 but showing the parts at subsequent stages.

A pair of lead cutting and clinching levers 18 and 20 (FIGS. 1-4), the latter considerably longer than the lever 18, is pivotally carried on the shaft 10 for counter-rotation thereon during operation. Although the shaft 10 is herein preferably largely cylindrical to provide axially spaced bearing surfaces for the levers 18, 20, it will be appreciated that the shaft could optionally be a shear bar of other cross section than cylindrical and still mount the levers for cooperative shearing of the leads prior to bending thereof by the levers; an elongated cutting edge could also be provided in the member 20 without necessarily providing a through-slot therein. The lever 18 is formed with a short through-slot or radial hole 22 initially aligned with the shaft hole 14, and an axially elongated through-slot 24 in the lever 20 is initially aligned with the shaft slot 16. This is to say the levers 18 and 20, when first raised for operation and supportive contact with the board B adjacent to the locality thereof from which the leads L protrude to be cut-clinched, have the hole 22 and the slot 24 (FIG. 2) respectively in alignment with the shaft hole 14 and shaft slot 16. It will be apparent that the component C may then be installed as shown in FIG. 1 with its formed left-hand lead projecting through the board B, the hole 22 in the lever 18, and into the shaft hole 14, and its formed right-hand lead extending, according to its variable spacing from the inserted left lead, through the board B, the slot 24, and into the shaft slot 16. The upper or operating positions of the levers 18 and 20 are shown in FIGS. 3-5 and their subsequent angular inactive positions (indicated by dash lines in FIG. 3) are established by return springs 26 (FIG. 2) each interconnected to an outer end of the respective levers and the support 12.

Figure 6:
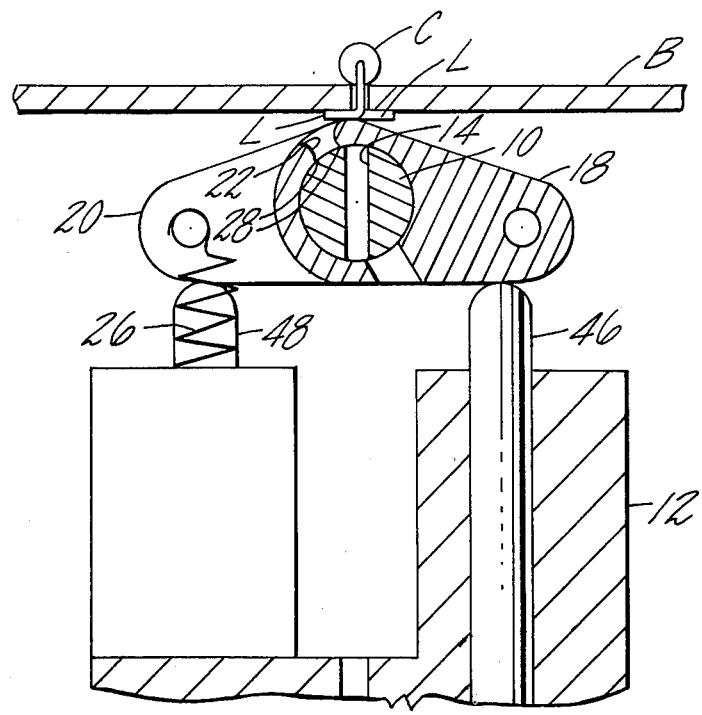
Figure 7:
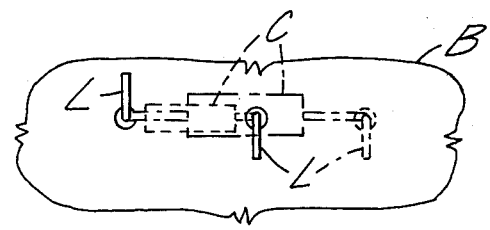
FIG. 7 is a bottom view of leads as clinched by the mechanism.

Referring to the sequential views (FIGS. 4-6), the cut-clinch unit operation will be described with reference to that lead L inserted through the initially aligned holes 14 and 22, it being understood that a simultaneously similar operation is being executed on the other lead L accommodated by slots 16 and 24. Upper lead-wiping edges defining the hole 22 (and the slot 24) are rounded to define an enlarged mouth portion, and the lower or inner peripheral edge 28 of the hole (and of the slot) is not rounded but serves, in cooperation with the upper periphery of the hole 14, to shear off an excess lead end portion P (FIG. 5) when the lever 18 is actuated counterclockwise. The portion P falls through the hole 14 and exists via the lower end of the hole 22 to an out of the way position. Meanwhile the further rotation of the lever 18 causes the shorn lead to be bent and wiped against the underside of the board B by the rounded, radially outer edge of the hole 22 and by the adjacent outer, rounded surface of the lever 18 to position the lead transversely of a line interconnecting the lead receiving holes of the board as shown in FIGS. 6 and 7. In the case of coaxial lead type components having cylindrical bodies C as shown, ends of the leads, when clinched, accordingly oppositely extend substantially at right angles to axes of the bodies.

Mechanism for actuating the levers 18 and 20 as aforesaid will now be described largely with reference to FIG. 3. The support 12 is secured as by bolts 30 to a cylinder 32 movable heightwise between limits to position the levers between their lower inoperative position and upper actual or near board-contacting position. For raising the cut-clinch unit bodily, pressure fluid, preferably air, is admitted via a port 34 to a cylindrical chamber 36 beneath the cylinder 32, the chamber 36 being formed in a rotatable housing 38 wherein the lower end of the cylinder 32 functions as a piston. FIG. 3 illustrates the cylinder 32 in its raised position, dash lines also showing its lower or inoperative position wherein adequate clearance is afforded to enable relative shifting of the board B and the cut-clinch mechanism between successive operations. FIG. 3 also illustrates that fluid under pressure, for instance air, is admitted through an axial bore 40 in a piston 42 to a chamber 44 within the cylinder 32 thus to elevate the piston 42 from its dash-line position to its upper or solid line position. Such raising of the piston 42, effected after the cut-clinch levers 18,20 have received the depending lead portions L as shown in FIGS. 1 and 4, causes actuating rods 46,48 respectively to abut the levers and displace them counter-rotatively about the shaft 10 with the results as described with reference to FIGS. 5 and 6.

After the cut-clinch operation, release of pressure in the chamber 44 enables potential energy of a return spring 50 confined between a collar 52 fixed on the piston 42 and the housing 38 to lower the support 12. The springs 26, which had been put in tension during upward operating movement of the rods 46,48 are accordingly now permitted to rotate the levers 18 and 20 to their initial, hole-and-slot aligned positions in readiness for the next cycle of operations on a successive component.

It should be noted that a guide stud 54 (FIGS. 2,3) vertically secured to a flange of the cylinder 32 is slidable heightwise in a bore 56 formed in the housing 38. Accordingly, rotation of the housing by means next to be described will also turn the shaft 10 and the cut-clinch levers 18,20 together about a vertical axis to accommodate different angular orientation of the leads as inserted in the board B. Referring to FIGS. 1-3 again, the outer periphery of the housing 38 is formed with spline teeth 58 for meshing with teeth of a horizontal rack 60. The housing 38 is constrained axially and transversely by suitable bearings 62,64, within an outer stationary casing 66 accommodating linear travel of the rack. For thus moving the rack, it is coupled by a tie bar 68 (FIG. 2) to a piston rod 70 of a cylinder 72 adapted to be pressurized as by air. Consequently, movement of the rack linearly will produce angular movement to the desired extent of the cut-clinch mechanism as a unit about its vertical axis. A stop 74 may be releasably positioned along the rack as by a set screw 76 to limit rack travel and hence determine preset two selected angular positions of the cut-clinch mechanism. Dash positions of the stop 74 in FIG. 1 indicate 45° stop increments. Overtravel of the rack linearly may be prevented by provision of a limit stop not shown but projecting from the rack at its end opposite to the tie bar 68. For convenience in the illustrative embodiment this axis is preferably aligned with the lead receiving holes 14 and 22 and hence the center of one of the two preformed lead-receiving holes of the board B, but it may, in some instances, be otherwise aligned if desired without departing from the scope of this invention.

Briefly to review operation of the cut-clinch mechanism it will be assumed the formed, but unclinched leads L,L of whatever center spacing range (as provided for by extension of the aligned slots 16 and 24 from the aligned openings 14 and 22) have been inserted either manually or by other mechanism and project downwardly from the board B. Suitable supporting means (not shown) for the cut-clinch mechanism, either an automatic X-Y positioning table or a manually shiftable carrier, for instance, will then align the hole 14 with one projecting lead end L and orient the slot 16 of the shaft 10 with respect to the other lead L. Fluid pressure is then admitted through the port 34 to the chamber 36 causing the raising of the cylinder 32 whereby upper surfaces of the pivotal levers 18 and 20 are brought into contact or near contact with the underside of the board B. Such elevation of the cut-clinch unit also lifts the support 12, the rods 46,48 and the piston 42 thereby causing the leads L,L to be received endwise in the aligned holes and slots as shown in FIGS. 3 and 4. As is customary in the art, a downward pressure on the component leads above the board is preferably maintained (by means now herein shown) to prevent upward movement of the board B and maintain heightwise position of the component during cutting and clinching.

Next, fluid under pressure is admitted through the bore 40 to raise the piston 42 and hence cause the rods 46,48 to pivot the levers 18,20 in opposite directions about the axis of the shaft 10. This produces the cutting of both leads as above described and finally, as shown in FIGS. 6 and 7, bends and wipes the lead ends against the circuit board. These lead ends then extend in opposite directions and transversely away from a line interconnecting their board holes thereby insuring that the body of the component C on the opposite side of the board B will be secured in stable condition and prevented from tilting or working loose.

If the orientation of the components C to be successively inserted, cut, and clinched as described changes, the cut-clinch unit will be suitably rotated as required by operation of the cylinder 72 and its rack 60, return rotation of the unit to a fixed and known orientation being determined by a return spring (not shown) in the cylinder 72 or as by having the cylinder dual acting in response to fluid pressure admitted into either of its ends.

Having thus described my invention what I claim as new and desire to secure as Letters Patent of the United States is:

1. Cut-clinch mechanism for operating on the variably spaced leads of components mounted on a circuit board or the like, said mechanism comprising means for pivotally supporting a pair of levers for rotation in opposite directions about an axis substantially parallel to the board, the means including a through-opening and an axially extending through-slot aligned therewith, one of the levers having a lead-receiving hole movable into and out of angular alignment with said through-opening and the other of said levers having an axially extending slot movable into and out of angular alignment with said through-slot, mechanism for moving the support means relative to the board to cause end portions of the leads of a component projecting therefrom to extend into the aligned hole and through-opening on the one hand and the aligned slots on the other hand, and other mechanism for counter-rotating the levers about said axis to cut the leads in cooperation with said support means and then bend and wipe the shorn lead portions in opposite directions against the circuit board.

2. Mechanism as in claim 1 wherein said support means is a shaft held against rotation relative to said levers and providing circular bearing surfaces for the levers.

3. Mechanism as in claim 2 wherein the shaft is longer than a line interconnecting lead-receiving holes of the component in said board and the levers rotate about a common axis parallel to said line.

4. Mechanism as in claims 1, 2 or 3 wherein the hole in one of the levers and the through-slot in the other respectively have a radially inner lead-cutting edge and a radially outer mouth edge adapted to bend and wipe a shorn lead portion against the board.

5. Mechanism as in claim 1 wherein said mechanism for moving the support means and said other mechanism are operable successively and independently of one another by fluid pressure means.

6. Mechanism as in claim 5 wherein a further fluid pressure-operated means is operatively connected to rotate said support means and said levers jointly about an axis substantially normal to the board to accommodate different lead orientation of components to be successively cut and clinched.

7. Mechanism as in claim 6 wherein said axis is aligned with the through-opening in said supporting means.

8. In a mechanism for cutting the clinching variably spaced leads of components mounted on circuit boards or the like, a cut-clinch unit movable toward and from the board, said unit comprising a shear bar and a pair of cut-clinch members mounted on the bar for movement in opposite directions relative to the bar and away from an initial operating position to shear and then wipe the leads against the board, said shear bar having a first lead-receiving hole or slot and an elongated axially aligned slot for respectively receiving endwise the variably spaced lead portions to be cut, and power means for moving the unit relative to the board and actuating the cut-clinch members when the lead portions of a component have been received in the hole and elongated slot.

9. A mechanism as in claim 8 wherein the power means comprises a first piston-cylinder device for controlling relative movement of approach between the board and the unit, and a second piston-cylinder device for actuating the cut-clinch members.

10. A mechanism as in claim 8 or 9 wherein one of the members of said unit has a radial lead-receiving through-hole or slot which in an initial position is in angular registration with the bar hole or slot, and the other of said members is formed with an axially elongated through-slot which in an initial position is in angular registration with the elongated slot in said cutter bar.

11. A mechanism as in claim 8 and a third piston-cylinder device operatively connected to the cut-clinch unit to rotate it predeterminedly about an axis perpendicular to the board when the board and unit are relatively retracted.

* * * * *